United States Patent
Windisch

(10) Patent No.: US 10,024,519 B2
(45) Date of Patent: Jul. 17, 2018

(54) CONVERSION ELEMENT AND A LIGHT-EMITTING DIODE INCLUDING SUCH A CONVERSION ELEMENT

(71) Applicant: OSRAM GmbH, Munich (DE)

(72) Inventor: Reiner Windisch, Pettendorf (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 14/754,804

(22) Filed: Jun. 30, 2015

(65) Prior Publication Data

US 2015/0300601 A1   Oct. 22, 2015

Related U.S. Application Data

(62) Division of application No. 14/128,683, filed as application No. PCT/EP2012/058548 on May 9, 2012.

(30) Foreign Application Priority Data

Jun. 30, 2011   (DE) .................. 10 2011 078 402

(51) Int. Cl.
  *C09K 11/08*   (2006.01)
  *F21V 9/16*    (2006.01)
  (Continued)

(52) U.S. Cl.
  CPC .............. *F21V 9/16* (2013.01); *C09K 11/025* (2013.01); *C09K 11/59* (2013.01); *C09K 11/646* (2013.01);
  (Continued)

(58) Field of Classification Search
  CPC . C09K 11/025; H01L 33/504; F21Y 2101/00; F21Y 2101/02
  (Continued)

(56) References Cited

U.S. PATENT DOCUMENTS

2004/0256974 A1   12/2004   Mueller-Mach et al.
2007/0057626 A1   3/2007    Kurihara et al.
(Continued)

FOREIGN PATENT DOCUMENTS

CN    101939857 A     1/2011
DE    102009037730 A1 2/2011
JP    2002038150 A1   2/2002

OTHER PUBLICATIONS

U.S. Non-Final Office Action based on U.S. Appl. No. 14/128,683 (11 pages) dated Sep. 6, 2016.
(Continued)

*Primary Examiner* — Christopher Raabe
(74) *Attorney, Agent, or Firm* — Viering, Jentschura & Partner mbB

(57) ABSTRACT

A conversion element for the wavelength conversion of electromagnetic radiation from a first wavelength range to electromagnetic radiation from a second wavelength range, which includes longer wavelengths than the first wavelength range, the conversion element includes: a matrix material, the optical refractive index of which is temperature-dependent, and at least two different types of luminophore particles wherein a multiplicity of luminophore particles of each of the types are distributed in the matrix material, luminophore particles of different types differ from one another in terms of average particle size and/or material, the conversion element, upon excitation by electromagnetic radiation from the first wavelength range emits mixed radiation including electromagnetic radiation from the first and the second wavelength range, and the correlated color temperature and/or the color locus of the mixed radiation remain(s) substantially the same when the matrix material is at a temperature of between 25° C. and 150° C.

11 Claims, 3 Drawing Sheets

(51) Int. Cl.
*H01L 33/50* (2010.01)
*C09K 11/02* (2006.01)
*C09K 11/59* (2006.01)
*C09K 11/64* (2006.01)
*C09K 11/77* (2006.01)
*H01L 33/00* (2010.01)
*F21K 9/64* (2016.01)
*F21Y 115/10* (2016.01)

(52) U.S. Cl.
CPC ............ *C09K 11/7774* (2013.01); *F21K 9/64* (2016.08); *H01L 33/005* (2013.01); *H01L 33/504* (2013.01); *F21Y 2115/10* (2016.08); *H01L 2933/0041* (2013.01)

(58) Field of Classification Search
USPC .......................................... 313/503
See application file for complete search history.

(56) References Cited

U.S. PATENT DOCUMENTS

| 2007/0259206 | A1* | 11/2007 | Oshio | C04B 35/581 428/690 |
| 2008/0290785 | A1* | 11/2008 | Schmidt | C09K 11/0883 313/501 |
| 2009/0008663 | A1 | 1/2009 | Shimizu et al. | |
| 2009/0272996 | A1 | 11/2009 | Chakraborty | |
| 2010/0142189 | A1 | 6/2010 | Hong et al. | |
| 2011/0176301 | A1* | 7/2011 | Liang | H01L 25/0753 362/231 |
| 2012/0146079 | A1 | 6/2012 | Baumann et al. | |

OTHER PUBLICATIONS

U.S. Office Action based on U.S. Appl. No. 14/128,683 (7 Pages) dated Apr. 5, 2016.

Chinese Office Action based on Application No. 201280023538.3 (5 Pages and 5 Pages of English translation) dated Aug. 27, 2015.

Notice of Allowance based on U.S. Appl. No. 14/128,683 (11 pages) dated Dec. 1, 2017.

* cited by examiner

CONVERSION ELEMENT AND A LIGHT-EMITTING DIODE INCLUDING SUCH A CONVERSION ELEMENT

RELATED APPLICATIONS

This application is a divisional application of U.S. patent application Ser. No. 14/128,683, filed Dec. 23, 2013, which is a national stage entry according to 35 U.S.C. § 371 of PCT application No.: PCT/EP2012/058548 filed on May 9, 2012, which claims priority from German application No.: 10 2011 078 402.0 filed on Jun. 30, 2011, and is incorporated herein by reference in its entirety.

TECHNICAL FIELD

A conversion element is specified.

SUMMARY

Various embodiments provide a conversion element having an improved efficiency. Various embodiments also provide a conversion element which can be used to generate light with improved temperature stability of the color locus.

In accordance with at least one embodiment of the conversion element, the conversion element is suitable for converting electromagnetic radiation from a first wavelength range to electromagnetic radiation from a second wavelength range, which includes longer wavelengths than the first wavelength range. That is to say that the conversion element is provided for the so-called "down conversion" of electromagnetic radiation. By way of example, the conversion element converts at least part of a primary radiation, for example blue light, to a secondary radiation, for example red, green and/or yellow light. Overall, the conversion element can then emit mixed radiation composed of the electromagnetic radiation from the first and second wavelength ranges.

The conversion element can be embodied as a self-supporting plate, which may be parallelepipedal, for example, as a flexible film or as potting material. The conversion element is suitable for being disposed downstream of a radiation-emitting component, in particular a light-emitting diode chip. The conversion element then converts the electromagnetic radiation from the first wavelength range generated by the radiation-emitting component during operation at least partly to electromagnetic radiation from the second wavelength range.

In accordance with at least one embodiment of the conversion element, the conversion element includes a matrix material. The matrix material is a material which is transmissive to the electromagnetic radiation from the first wavelength range and electromagnetic radiation from the second wavelength range and which may be designed to be transparent for example to electromagnetic radiation from these wavelength ranges. The matrix material has an optical refractive index that is temperature-dependent. In particular, the refractive index is temperature-dependent in a temperature range of approximately 20° C. to approximately 200° C. By way of example, the optical refractive index decreases with rising temperatures in this temperature range. The matrix material may be a silicone or an epoxy resin, for example. Furthermore, it is possible for the matrix material to be a mixture composed of silicone and epoxy resin.

In accordance with at least one embodiment of the conversion element, the conversion element includes at least two different types of luminophore particles, wherein a multiplicity of luminophore particles of each of these types are distributed in the matrix material. The matrix material surrounds the luminophore particles distributed in it, for example in a positively locking manner. That is to say that the luminophore particles may be embedded into the matrix material. In this case, it is possible for the luminophore particles of the different types to be distributed randomly and as uniformly as possible in the matrix material. Furthermore, it is also possible for an accumulation of luminophore particles to occur at specific locations of the matrix material, said accumulation arising for example as a result of the luminophore particles sinking in the matrix material.

In accordance with at least one embodiment of the conversion element, luminophore particles of different types differ in terms of at least one of the following properties: the average particle size and/or the material. In this case, it is also possible for the different types of luminophore particles to differ from one another in terms of both properties. That is to say that the luminophore particles of different types can be formed with different luminescence conversion materials and/or have on average different sizes. As a result, the luminophore particles of different types have, for example, mutually different emission wavelengths and/or different scattering behaviors.

In accordance with at least one embodiment of the conversion element, the conversion element, upon excitation by electromagnetic radiation from the first wavelength range, emits mixed radiation including electromagnetic radiation from the first and second wavelength ranges. That is to say that at least part of the electromagnetic radiation from the first wavelength range that enters into the conversion element is not converted, but rather leaves the conversion element without being converted, such that mixed radiation including converted and unconverted electromagnetic radiation emerges from the conversion element. By way of example, said mixed radiation is white or colored light.

In accordance with at least one embodiment of the conversion element, the correlated color temperature and/or the color locus of the mixed radiation remain(s) substantially the same when the matrix material is at a temperature of between 20° C. and 200° C., in particular between 25° C. and 150° C. In this case, "substantially the same" means, for example, that an average observer of the mixed radiation, in the case of a temperature change in the stated temperature range, cannot ascertain any change to the correlated color temperature and/or the color locus with the naked eye. Therefore, to the observer the emitted mixed radiation appears to be constant with regard to cover temperature and/or color locus even in the case of temperature fluctuations.

In accordance with at least one embodiment of the conversion element, the conversion element includes a matrix material, the optical refractive index of which is temperature-dependent, and at least two different types of luminophore particles, wherein a multiplicity of luminophore particles of each of the types are distributed in the matrix material, luminophore particles of different types differ from one another in terms of average particle size and/or material, the conversion element, upon excitation by electromagnetic radiation from the first wavelength range emits mixed radiation including electromagnetic radiation from the first and the second wavelength range, and the correlated color temperature and/or the color locus of the mixed radiation remain(s) substantially the same when the matrix material is at a temperature of between 25° C. and 150° C.

A conversion element described here is in this case based on the following considerations, inter alia:

During the operation of an optoelectronic component downstream of which a conversion element is disposed, the temperature of the conversion element changes as a result of the heating of the conversion element on account of waste heat from the optoelectronic component and/or conversion losses. The change in the temperature of the conversion element generally leads to a change in the color locus and thus also to a change in the correlated color temperature of the mixed light emitted by the conversion element. This is undesirable for example when the conversion element is used in general lighting, since, as a result, the color impression of the generated light can change depending on ambient temperature and depending on operating duration of the optoelectronic component, which is perceived as unpleasant by the observer.

The shift in the color locus is caused by an interaction of many physical processes such as, for example:

the temperature-dependent shift of the electromagnetic radiation from the first wavelength range generated by the optoelectronic component, the temperature dependence of the quantum efficiency of the luminophore conversion, the temperature dependence of the luminophore absorption, the temperature dependence of the luminophore emission spectrum, the temperature dependence of the light scattering in the conversion element on account of the temperature dependence of the refractive index of the matrix material of the conversion element.

Particularly in the case of conversion elements which contain particles of luminophores in the matrix material, the change in the refractive index of the matrix material with temperature plays an important part. By way of example, the refractive index decreases as the temperature of the matrix material rises, as a result of which the light scattering at the luminophore particles introduced in the matrix material generally increases since the difference in refractive index between the luminophore particles and the matrix material increases. An increase in the scattering leads to a lengthening of the average propagation distance of the electromagnetic radiation from the first wavelength range in the conversion element and thus to an increase in the absorption of electromagnetic radiation from the first wavelength range. In this way, therefore, the probability of conversion by luminophore particles of the conversion element increases, which leads to a color locus shift in the conversion direction.

Since the first three of the abovementioned processes very generally lead to a color locus shift in the direction of the electromagnetic radiation from the first wavelength range, the change in refractive index brings about a partial compensation of this color locus shift. The extent to which this compensation arises is dependent on the properties of the luminophore particles used, in particular on the refractive index thereof and the particle size distribution, and on the matrix material used. It has previously been established that the compensation is generally too small, however, to appreciably alter the shift in the direction of the electromagnetic radiation from the first wavelength range, that is to say for example in the direction of blue.

One solution to this problem might consist in admixing with the matrix material additional, non-converting scattering particles, composed of a material whose refractive index either at room temperature or at the typical operating temperature is as close as possible to the refractive index of the matrix material. With utilization of the temperature-dependent change in the refractive index of the matrix material, these scattering particles then provide for additional or reduced scattering, depending on the temperature, and can stabilize the color locus of the emitted mixed radiation in this way. However, this is associated with a reduction of the efficiency on account of additional scattering losses at the scattering particles, at least at the temperatures of the matrix material at which the refractive indices of scattering particles and matrix material are not identical.

In the present case, therefore, it is proposed, inter alia, to use in the conversion element a mixture of different luminophore types, the mixture of which is optimized deliberately in such a way that a stabilization of color temperature and/or color locus occurs over a large temperature range. In this case, however, it should be taken into consideration that the refractive index of luminophore particles cannot be chosen freely, since it is given by the material of the luminophore particles, the choice of which material is in turn determined by the intended emission wavelength of the luminophore particles.

A conversion element described here is based on the concept, inter alia, of mixing at least two luminophores of different types in such a way that the color locus remains virtually constant in the case of a change in temperature in a relatively wide temperature range and/or the correlated color temperature does not change in a wide temperature range. This can be achieved by the use of at least two different types of luminophores, wherein, in the case of one of the luminophores described, the compensation of the shift toward electromagnetic radiation from the first wavelength range turns out to be too small and, in the case of the second type of luminophores, an overcompensation occurs, that is to say that, for particles of this luminophore, the mixed radiation would shift in the direction of the electromagnetic radiation from the second wavelength range.

In accordance with at least one embodiment of the conversion element, the correlated color temperature of the mixed radiation varies by at most 60 K when the matrix material is at a temperature of between 25° C. and 150° C. In other words, the correlated color temperature remains largely stable in this temperature range of the matrix material.

In accordance with at least one embodiment of the conversion element, the color locus of the mixed radiation lies within a three-step McAdam ellipse when the matrix material is at a temperature of between 25° C. and 150° C. In particular, it is possible for the color locus of the mixed radiation to lie within a one-step McAdam ellipse in the stated temperature range. In this case, the color locus shifts mentioned can hardly be perceived or cannot be perceived at all by the human observer.

In accordance with at least one embodiment of the conversion element, the refractive index of the matrix material decreases in a temperature range of between 25° C. and 150° C. with rising temperature of the matrix material. By way of example, this applies to a matrix material which is formed with a silicone or consists of a silicone.

In accordance with at least one embodiment of the conversion element, the matrix material is substantially free of particles of a scattering material. In this case, a scattering material is understood to mean a material without wavelength-converting properties. "Substantially free" means that the concentration of particles of a scattering material, which particles can be present in the matrix material for example as residues from the production of the luminophore particles, is at most 0.1% by weight relative to the total weight of the conversion element. In other words, a scattering material is not deliberately introduced into the matrix material of the conversion element.

In accordance with at least one embodiment of the conversion element, the conversion element includes three types of luminophore particles, wherein two types of luminophore particles have an identical or similar first emission wavelength range. In other words, two types of luminophore particles have an emission wavelength range in which the maximum of the emission wavelength differs from one another by less than 60 nm, in particular by less than 50 nm. The two types of luminophore particles then re-emit light of the same color, in particular. Upon observation of the dominant wavelength, the difference between the emission maxima of the two types of luminophore particles is preferably at most 30 nm, in particular at most 20 nm. Furthermore, it is possible for the luminophore particles of different types to be formed with the same material and therefore to have an identical emission wavelength range.

In accordance with this embodiment, the conversion element may include a third type of luminophore particles, which has a further emission wavelength range, the maximum of which deviates from the maximum of the first emission wavelength range by at least 100 nm, in particular by at least 150 nm.

In other words, the luminophore particles of the third type emit light of a different color than the luminophore particles of the first and second types.

In accordance with at least one embodiment of the conversion element, the luminophore particles of at least two of the different types consist of different materials and have a similar emission wavelength range.

By way of example, the conversion element may include three types of luminophore particles composed of the following materials: LuAGaG:Ce as luminophore particles which re-emit green light, $(Sr,Ca,Ba)_2Si_5N_8$ as luminophore particles which emit red light, and CaAlSiN likewise as luminophore particles which emit red light. For the luminophore particles mentioned last, the overcompensation described above arises, while the luminophore particles mentioned second do not enable sufficient compensation of the color locus shift by a change of the scattering. In the mixture of the three stated types of luminophore particles in the common matrix material, which is formed with silicone, for example, this results in a virtually constant color temperature in the abovementioned temperature range.

In accordance with at least one embodiment of the conversion element, the luminophore particles of at least two of the different types of luminophore particles are formed from the same material and differ with regard to their average particle size. In this case, the scattering effect at different temperatures is determined by the different particle sizes. The mixture of luminophore particles having different average particle sizes makes it possible to deliberately set the scattering properties for electromagnetic radiation from the first wavelength range which enters into the conversion element.

A light-emitting diode is furthermore specified. A conversion element described here can be used in the light-emitting diode. That is to say that all features described for the conversion element are also described for the light-emitting diode.

In accordance with at least one embodiment of the light-emitting diode, the light-emitting diode includes at least one light-emitting diode chip which emits electromagnetic radiation from the first wavelength range during operation. This involves blue light, for example. Furthermore, the light-emitting diode includes a conversion element described here, which is disposed downstream of the light-emitting diode chip in such a way that at least part of the electromagnetic radiation from the first wavelength range passes into the conversion element and is converted to electromagnetic radiation from the second wavelength range. The electromagnetic radiation from the two wavelength ranges then mixes to form mixed radiation, which can be white light, for example. In this case, the conversion element may be applied as a thin layer to a radiation exit surface of the light-emitting diode chip. Furthermore, it is possible for a prefabricated conversion element, for example in the form of a lamina or a film, to be applied to the radiation exit surface of the light-emitting diode chip. Furthermore, it is possible for the conversion element to envelop the light-emitting diode chip in a positively locking manner. In this case, the conversion element is applied to the light-emitting diode chip for example in the manner of a potting material by injection molding or transfer molding.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1:
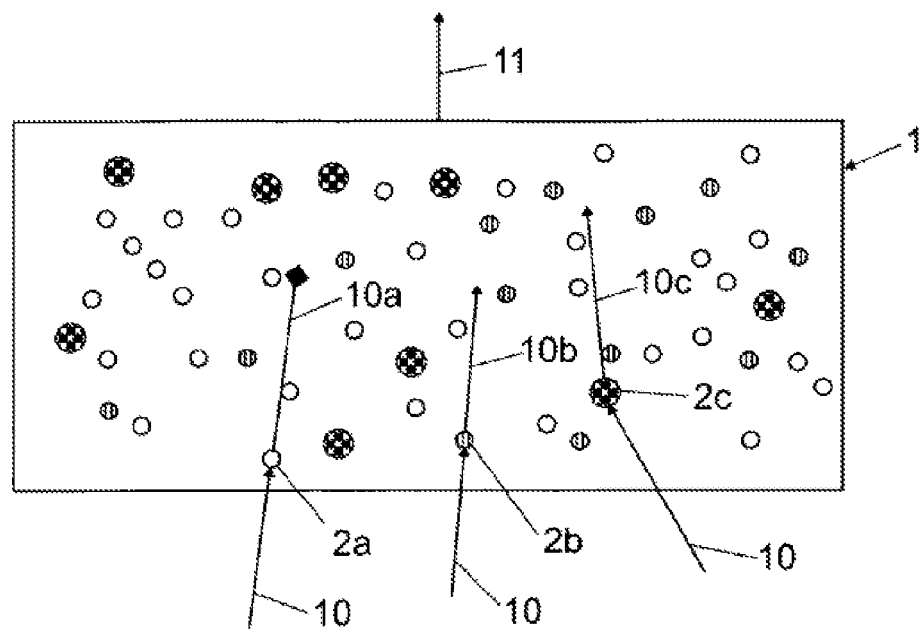
FIG. 1 shows an embodiment of a conversion element described here on the basis of a schematic sectional illustration.

The schematic sectional illustration in FIG. 1 schematically illustrates a conversion element 1 described here. The conversion element 1 includes a matrix material 3, which is formed of a silicone, for example. In a temperature range of at least 25° C. to at most 150° C., for example, the optical refractive index of the matrix material 3 decreases with rising temperature.

A multiplicity of luminophore particles are introduced into the matrix material 3. In this case, into the matrix material 3 in the embodiment in FIG. 3, three different types of luminophore particles are introduced into the matrix material 3. By way of example, the conversion element 1 includes the following types of luminophore particles: luminophore particles of first type 2a, which are formed with LuAGaG:Ce, luminophore particles of second type 2b, which are formed with $(Sr,Ca,Ba)_2Si_5N_8$, and luminophore particles of third type 2c, which are formed with CaAlSiN.

Electromagnetic radiation 10 from a first wavelength range which enters into the conversion element 1 is partly wavelength-converted by the luminophore particles, wherein electromagnetic radiation from a second wavelength range 10a, 10b, 10c is generated. The latter radiation mixes with the electromagnetic radiation from the first wavelength range 10 to form mixed radiation 11, which can be white light, for example. In the present case, the luminophore particles of the first type 2a emit green light 10a, the luminophore particles of the second type 2b emit red light 10b and the luminophore particles of the third type 2c likewise emit red light 10c. In the present case, the luminophore particles of the second type and third type are formed from different materials, but have a similar emission wavelength, that is to say that the maximum of the emission wavelength of both types of luminophore particles differs by less than 50 nm.

Figure 3:
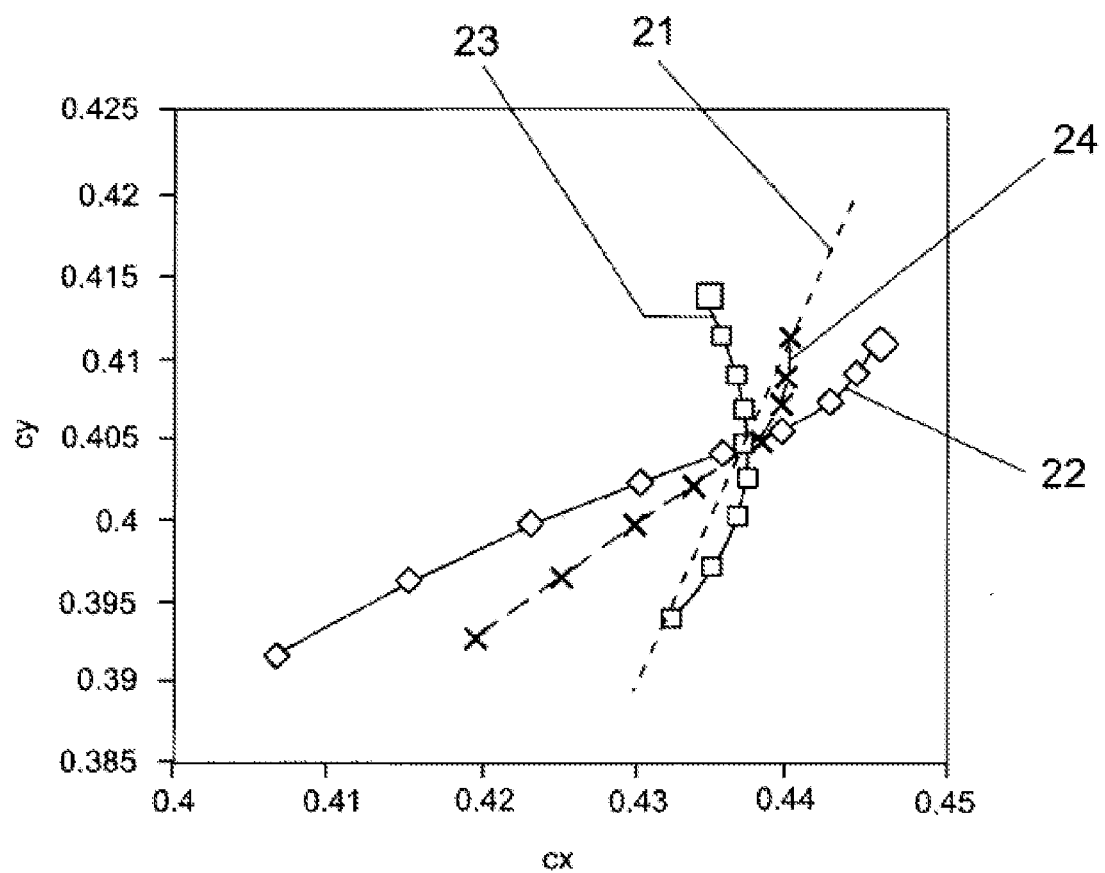
FIGS. 3 and 4 show properties of conversion elements and light-emitting diodes described here on the basis of graphical plots.

Color loci for different conversion elements at different temperatures of the matrix material are plotted in conjunction with FIG. 3.

The starting point is chosen at 25° C. and represented by the thick symbols of the curves 22, 23 and 24 in the graphical plot in FIG. 3. The Judd straight line 21 is entered in FIG. 3 in a dashed fashion.

The curve 22 relates to a first luminophore mixture including the following luminophores: $(Sr,Ca,Ba)_2Si_5N_8$, LuAGaG:Ce. The curve 23 relates to a second luminophore mixture including the following luminophores: LuAGaG:Ce, CaAlSiN. The curve 24 relates to a third luminophore mixture including the following luminophores LuAGaG:Ce, CaAlSiN, $(Sr,Ca,Ba)_2Si_5N_8$, that is to say the luminophores of the first and second luminophore mixtures. In the luminophore mixture mentioned last, the two red luminophores are introduced for example in a ratio of 1:1.

In this case, the individual measurement points of the curves 22, 23 and 24 are each spaced apart from one another by 25° C. In this case, the concentrations of the individual luminophore particles are set in such a way that approximately the same color locus is attained by all the luminophore mixtures at approximately 125° C. The curve 21 represents the Judd straight line for 3000 K, showing the color loci with identical most similar color temperature. This line is simultaneously the major axis of a McAdams ellipse. A change in color locus along this line is virtually imperceptible to the human eye. If a mixture of luminophores including the three stated types of luminophore particles, curve 24, is used, wherein the red luminophores are present in a mixture of approximately 1:1, then the color locus of the mixed light, 11, runs approximately along the Judd straight line 21 in the range between 25° C. and 150° C.

Figure 4:
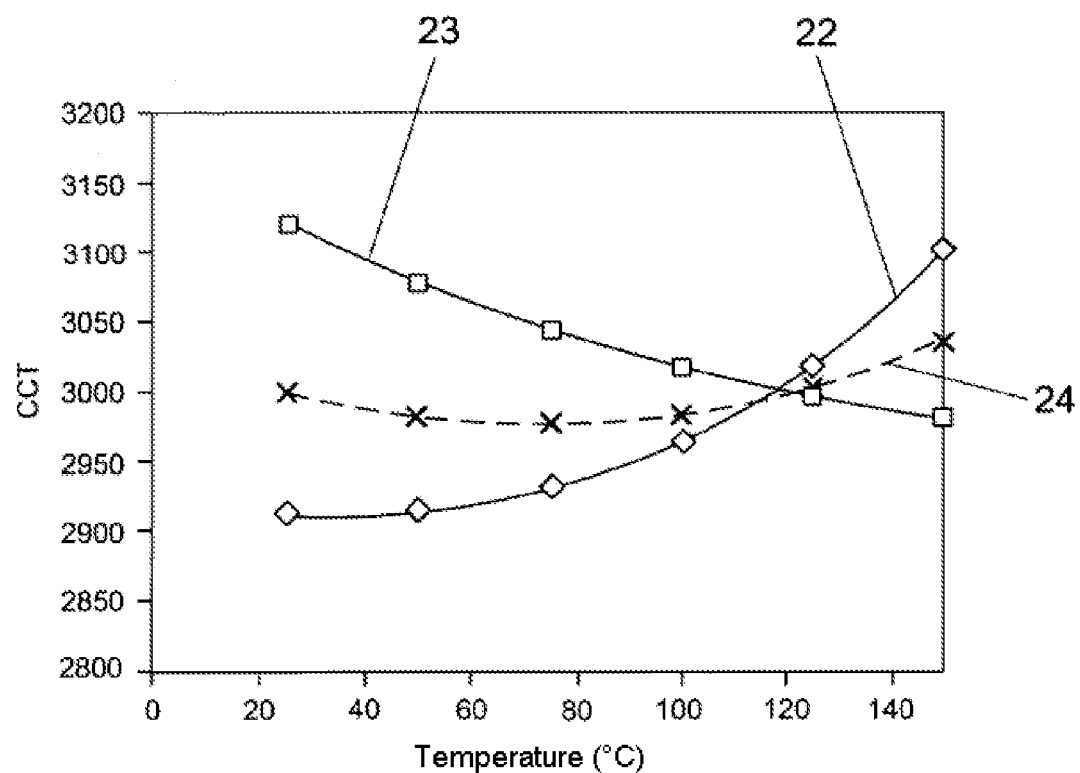

FIG. 4 shows a graphical plot in which the color temperature is plotted as a function of the temperature of the matrix material for the three luminophore mixtures. It is evident from this illustration that the variation of the color temperature between 25° C. and 150° C. is less than 50 K for the curve 24.

Figure 2:
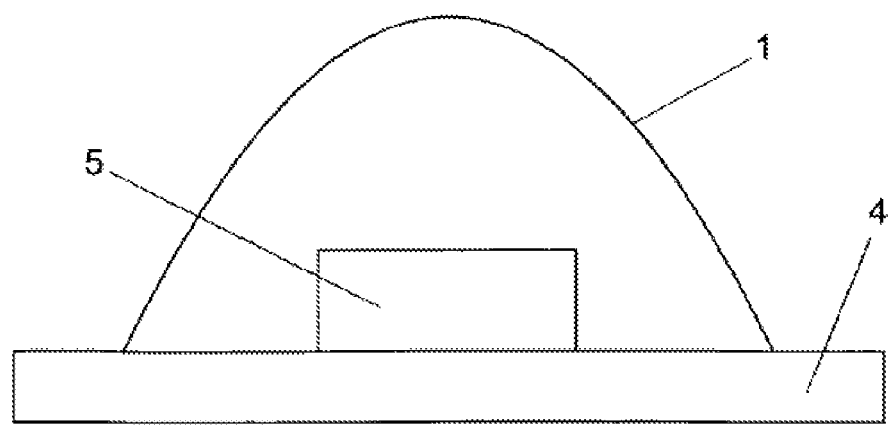
FIG. 2 shows an embodiment of a light-emitting diode described here on the basis of a schematic sectional illustration.

The schematic sectional illustration in FIG. 2 illustrates a light-emitting diode including a conversion element 1 described here. The light-emitting diode includes a carrier 4, which is, for example, a connection carrier such as a leadframe or a printed circuit board on which a light-emitting diode chip 5 that emits blue light is applied. The light-emitting diode chip 5 is enveloped by the conversion element 1 in a positively locking manner, for example plotted therewith.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

What is claimed is:

1. A method for producing a conversion element comprising:
   choosing a matrix material;
   distributing at least two different types of luminophore particles in the material matrix; wherein the at least two different luminophore particles comprise at least $(Sr,Ca,Ba)_2Si_5N_8$ and CaAlSiN in a 1:1 ratio;
   wherein the correlated color temperature and the color locus of the electromagnetic radiation emitted from the at least two different luminophore particles are substantially the same at a temperature between at least 25° C. and at most 150° C.;
   distributing the multiplicity of second luminophore particles in the material matrix.

2. The method as claimed in claim 1, wherein a multiplicity of second luminophore particles are chosen such that correlated color temperature of the mixed radiation varies by at most 60 K when the matrix material is at a temperature of between at least 25° C. and at most 150° C.

3. The method as claimed in claim 2, wherein the multiplicity of second luminophore particles are chosen such that color locus of the mixed radiation lies within a three-step McAdam ellipse when the matrix material is at a temperature of between at least 25° C. and at most 150° C.

4. The method as claimed in claim 1, wherein matrix material is chosen such that the refractive index decreases with rising temperature in the temperature range of between at least 25° C. and at most 150° C.

5. The method as claimed in claim 1, wherein the matrix material is chosen such that the matrix material is substantially free of particles of a scattering material.

6. The method as claimed in claim 1, further comprising:
   choosing a multiplicity of third luminophore particles;
   wherein second luminophore particles are chosen to have an identical or a similar first emission wavelength range to first luminophore particles and the third luminophore particles have a further emission wavelength range, the maximum of which deviates from the maximum of the first emission wavelength range by at least 100 nm.

7. The method as claimed in claim 6, wherein the luminophore particles of at least two of the different multiplicities consist of different materials and have a similar emission wavelength range.

8. The method as claimed in claim 6, further comprising luminophore particles composed of LuAGaG:Ce, luminophore particles composed of $(Sr,Ca,Ba)2Si5N8$ and luminophore particles composed of CaAlSiN.

9. The method as claimed in claim 6, wherein the luminophore particles of at least two of the different multiplicities consist of the same material and have different average particle sizes.

10. The method as claimed in claim 1, enveloping a light-emitting diode chip in a positively locking manner.

11. A method for producing a conversion element comprising:
    choosing a matrix material;
    distributing at least two different types of red luminophore particles in the material matrix; wherein the two different types of red luminophore particles comprise at least two different types of red luminophores in a 1:1 ratio; wherein the at least two different types of red luminophores are not rare earth elements;
    wherein the correlated color temperature and the color locus of the electromagnetic radiation emitted from the at least two different luminophore particles are substantially the same at a temperature of between at least 25° C. and at most 150° C.;

distributing the multiplicity of second luminophore particles in the material matrix.

* * * * *